United States Patent
Kasai et al.

(10) Patent No.: US 7,659,137 B2
(45) Date of Patent: Feb. 9, 2010

(54) STRUCTURE CAPABLE OF USE FOR GENERATION OR DETECTION OF ELECTROMAGNETIC RADIATION, OPTICAL SEMICONDUCTOR DEVICE, AND FABRICATION METHOD OF THE STRUCTURE

(75) Inventors: Shintaro Kasai, Atsugi (JP); Toshihiko Ouchi, Sagamihara (JP); Masatoshi Watanabe, Isehara (JP); Mitsuru Ohtsuka, Yamato (JP); Taihei Mukaide, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 242 days.

(21) Appl. No.: 11/088,719

(22) Filed: Mar. 25, 2005

(65) Prior Publication Data
US 2005/0233490 A1    Oct. 20, 2005

(30) Foreign Application Priority Data
Mar. 26, 2004  (JP) ............................. 2004-092400
Mar. 3, 2005   (JP) ............................. 2005-058438

(51) Int. Cl.
   *H01L 21/20*  (2006.01)
(52) U.S. Cl. .............................. 438/94; 438/46; 438/47; 438/93; 257/E21.097; 257/E21.098; 257/E21.108; 257/E21.109
(58) Field of Classification Search .................. 438/46, 438/47, 93, 94; 257/E21.097–E21.098, E21.108–E21.109
See application file for complete search history.

(56) References Cited

U.S. PATENT DOCUMENTS

| | | | |
|---|---|---|---|
| 5,471,948 A * | 12/1995 | Burroughes et al. ........... 438/93 |
| 5,659,188 A * | 8/1997 | Kao et al. .................. 257/190 |
| 5,701,325 A | 12/1997 | Ouchi et al. ................. 372/96 |
| 5,850,408 A | 12/1998 | Ouchi et al. ................. 372/27 |
| 6,046,096 A | 4/2000 | Ouchi et al. ................ 438/510 |
| 6,055,251 A | 4/2000 | Ouchi et al. ................. 372/28 |
| 6,089,442 A | 7/2000 | Ouchi et al. ............. 228/180.1 |
| 6,222,868 B1 | 4/2001 | Ouchi et al. ................. 372/50 |
| 6,320,691 B1 | 11/2001 | Ouchi et al. ................ 359/237 |
| 6,455,398 B1 * | 9/2002 | Fonstad et al. .............. 438/459 |

(Continued)

OTHER PUBLICATIONS

Warren et al., Role of excess As in low-temperature-grown GaAs, Physical Review B, vol. 46, p. 4617-4620, August 1992.*

(Continued)

*Primary Examiner*—Kiesha L. Rose
*Assistant Examiner*—Minchul Yang
(74) *Attorney, Agent, or Firm*—Fitzpatrick, Cella, Harper & Scinto

(57) ABSTRACT

A fabrication method of fabricating a structure capable of being used for generation or detection of electromagnetic radiation includes a forming step of forming a layer containing a compound semiconductor on a substrate at a substrate temperature below about 300° C., a first heating step of heating the substrate with the layer in an ambience containing arsenic, and a second heating step of heating the substrate with the layer at the substrate temperature above about 600° C. in a gas ambience incapable of chemically reacting on the compound semiconductor. Structures of the present invention capable of being used for generation or detection of electromagnetic radiation can be fabricated using the fabrication method by appropriately regulating the substrate temperature, the heating time, the gas ambience and the like in the second heating step.

9 Claims, 11 Drawing Sheets

U.S. PATENT DOCUMENTS

| | | | | |
|---|---|---|---|---|
| 6,477,286 | B1 | 11/2002 | Ouchi | 385/14 |
| 6,507,594 | B1 | 1/2003 | Furukawa et al. | 372/36 |
| 6,586,769 | B1 | 7/2003 | Watanabe et al. | 257/72 |
| 6,771,677 | B2 | 8/2004 | Furukawa et al. | 372/36 |
| 6,812,494 | B2 | 11/2004 | Mochizuki et al. | 257/75 |
| 6,836,579 | B2 | 12/2004 | Ouchi | 385/14 |
| 6,909,116 | B2 | 6/2005 | Watanabe et al. | 257/72 |
| 6,970,612 | B2 | 11/2005 | Ouchi | 385/14 |
| 2003/0127673 | A1* | 7/2003 | Williamson et al. | 257/293 |
| 2004/0145026 | A1* | 7/2004 | Sun et al. | 257/459 |
| 2005/0020033 | A1* | 1/2005 | Specht et al. | 438/478 |
| 2005/0051779 | A1 | 3/2005 | Watanabe et al. | 257/72 |
| 2005/0215031 | A1 | 9/2005 | Ouchi | 438/459 |

OTHER PUBLICATIONS

Bernstein et al., GaAs(I00) substrate cleaning by thermal annealing in hydrogen, J. Vac. Sci. Technol. A 9 (3), p. 581-584, Jun. 1989.*

Tani et al., Emission characteristics of photoconductiveantennas based on low-temperature-grown GaAsand semi-insulating GaAs, Applied Optics, 36, p. 7853-7859, 1997.*

Leon, Effects of interdiffusion on the luminescence of InGaAs/GaAs quantum dots, (Appl. Phys. Lett. 69, 1888-1890, 1996).*

Baker, Terahertz pulsed imaging with 1.06 mm laser excitation, (Appl. Phys. Lett. 83, 4113-4115, 2003).*

A.C. Warren, et al. "Arsenic Precipitates and the Semi-Insulating Properties of GaAs Buffer Layers Grown by Low-Temperature Molecular Beam Epitaxy" Appl. Phys Lett. 57 (13), Sep. 24, 1990; pp. 1331-1333.

A.C. Warren, et al. "Subpicosecond, Freely Propagating Electromagnetic Pulse Generation and Detection Using GaAs: As Epilayers" Appl. Phys Lett. 58 (14), Apr. 8, 1991; pp. 1512-1514.

Masahiko Tani, Et al. "Emission Characteristics of Photoconductive Antennas Based on Low-Temperature-Grown GaAs and Semi-Insulating GaAs" Applied Optics/ vol. 36, No. 30, Oct. 20, 1997; pp. 7853-7859.

Toshiaki Ikoma et al., Electronic Material "Gallium Arsenide" published by Maruzen Co., Ltd. pp. 28-29 (partial translation).

Shantanu Gupta and John F. Whitaker, "Ultrafast Carrier Dynamics in III-V Semiconductors Grown by Molecular-Beam Epitaxy at Very Low Substrate Temperatures," IEEE Journal of Quantum Electronics, vol. 28, No. 10, Oct. 1992, pp. 2464-2472.

Japanese Office Action issued Oct. 14, 2008, in Japanese Application No. 2005-058438.

* cited by examiner

⇩ HEATING IN GROWTH APPARATUS IMMEDIATELY AFTER EPITAXIAL GROWTH OF GaAs FILM

STRUCTURE CAPABLE OF USE FOR GENERATION OR DETECTION OF ELECTROMAGNETIC RADIATION, OPTICAL SEMICONDUCTOR DEVICE, AND FABRICATION METHOD OF THE STRUCTURE

BACKGROUND OF THE INVENTION

1. Field of the Invention

The present invention relates to a structure capable of being used for generation or detection of electromagnetic radiation, an optical semiconductor device, and a fabrication method of the structure, and particularly to techniques for generation or detection of high-frequency electromagnetic radiation such as terahertz (THz) electromagnetic radiation or wave. In this specification, the terahertz (THz) electromagnetic radiation (terahertz (THz) radiation or wave) is used for radiation in a frequency range between about 30 GHz and about 30 THz.

2. Description of the Related Background Art

A photoconductive antenna (a photoconductive device) using an optical switching device has been frequently employed for generation of high-frequency electromagnetic radiation such as THz radiation. A device for generating or detecting the THz radiation using a photoconductive element is, for example, a device which includes a photoconductive portion and two conductive portions formed on a predetermined face of the photoconductive portion in a mutually-separated manner, and in which at least portions of the two conductive portions are spaced from each other with a predetermined gap therebetween along the above-mentioned predetermined face.

The THz radiation is generated using the above device in the following manner. Even when a bias voltage is applied between the two conductive portions, almost no current flows since a resistance between the two conductive portions (a gap portion) is normally very large. Upon irradiation of the gap portion with exciting pulse light such as femtosecond pulsed laser light, free carriers are generated at the gap portion. At that moment, the resistance of the gap portion lowers, and a current flows between the conductive portions. It is accordingly possible to generate THz radiation whose electric-field amplitude is proportional to a value obtained by the time derivative of the above pulse current (a photocurrent is defined by a current, including this pulse current, generated by exciting light). At this moment, the conductive portions act as an antenna, and electromagnetic radiation with a frequency corresponding to the shape of the conductive portions is emitted toward the outside of the photoconductive device.

Antennas including dipole type, bow-tie type, strip-line type, and the like can be used for such an antenna structure. Here, generation of the THz electromagnetic radiation is guaranteed by the material, structure, and the like of the photoconductive portion, and a specific frequency of the electromagnetic radiation in a range of the THz frequency is determined by the profile of the exciting pulse light, the shape of the conductive portions and the like.

The magnitude of the bias voltage is about 20 V in the case of a photoconductive device with a conductive portion having a so-called dipole antenna structure with a gap of about 5 μm between the conductive portions. In the case of a large-aperture photoconductive device with a gap of about several centimeters between the conductive portions, the bias voltage sometimes amounts to several tens kV. In both cases, the electric field between the conductive portions is very strong, and the intensity of THz radiation to be generated increases as the electric field becomes large.

In this specification, the light-terahertz (THz) radiation (or electromagnetic radiation) converting efficiency is defined by a value obtained by dividing energy of THz radiation generated from the photoconductive device upon application of a bias voltage of 1 V between conductive portions by energy of exciting light incident on the photoconductive device.

A method of detecting the THz radiation using a photoconductive device is carried out in the following manner. A gap portion (a photoconductive portion) is irradiated with exciting pulse light, such as femtosecond pulsed laser light, to generate free carriers at the gap portion. At the same time, THz radiation is caused to impinge on the gap portion. The free carriers generated at the gap portion by the exciting pulse light are accelerated by the electric field caused by the THz radiation. Here, the THz radiation can be detected by detection of a current flowing between the photoconductive portions.

In this specification, the terahertz (THz) radiation (or electromagnetic radiation) detecting sensitivity (A/W) is defined by a value obtained by dividing a current (A) flowing between photoconductive portions by energy of the input THz radiation when the THz radiation is detected by the irradiation of the photoconductive portion with exciting light of 1 mW.

It is required for a photoconductive device having a high light-THz radiation converting efficiency that the mobility of free carriers generated at the photoconductive portion by the exciting light should be large. The reason therefor is that a value of the time derivative of a photocurrent increases as the mobility of the free carriers increases.

It is similarly required for a photoconductive device having a high THz radiation detecting sensitivity that the mobility of free carriers generated at the photoconductive portion by the exciting light should be large. This is because the free carriers can be readily accelerated by the THz radiation and a large current is created if the mobility of free carriers is large.

In a conventional example of a fabrication method of a photoconductive device, a GaAs film 52 is epitaxially grown on a semi-insulating GaAs substrate 51 under a condition in which the semi-insulating GaAs substrate 51 is maintained at a temperature below about 300° C., as illustrated in FIGS. 11A and 11B. This GaAs film 52 contains an excessive amount of arsenic precipitates, and point defects 56 are formed thereby. The point defect 56 acts as a recombination center for free carrier (see FIG. 11A). Accordingly, the carrier lifetime of the free carrier is short, and the mobility of carriers is likely to decrease (see A. C. Warren, et. al., "Arsenic precipitates and the semi-insulating properties of GaAs buffer layers grown by low-temperature molecular beam epitaxy", Appl. Phys. Lett. 57, p. 1331, 1990).

After the epitaxial growth, the semi-insulating GaAs substrate 51 is heated at about 600° C. in an arsenic ambience using the same apparatus. The thus-fabricated GaAs film is called an LT(low-temperature-grown)-GaAs film 52a (see FIG. 11B). It is known that the LT-GaAs film has a longer carrier lifetime (i.e., a larger mobility of carriers), and a higher resistivity than the GaAs film of FIG. 1A. In other words, in the LT-GaAs film, an arsenic cluster 57 due to cohesion of the excessive arsenic precipitates is formed. In a region outside the arsenic clusters 57, there is formed a stoichiometric GaAs crystal. Accordingly, the mobility of the free carriers increases, and impurity levels for supplying free carriers decrease, leading to an enhancement of the resistivity (see FIG. 11B and A. C. Warren, et. al., "Subpicosecond, freely propagating electromagnetic pulse generation and detection using GaAs:As epilayers", Appl. Phys. Lett., vol. 58, p. 1512, 1990).

With reference to FIGS. 9A to 9D, a description will be given for a conventional example of a fabrication method of a photoconductive device disclosed in M. Tani, et. al., "Emission characteristics of photoconductive antennas based on low-temperature-grown GaAs and semi-insulating GaAs", Appl. Opt. vol. 36, p. 7853, 1997. Using a molecular-beam epitaxy, a GaAs film 52 with a thickness of 1.5 μm is grown on a (100) face of a semi-insulating GaAs substrate 51 with a thickness of 500 μm (see FIG. 9A) under a condition in which the semi-insulating GaAs substrate 51 is maintained at 250° C., as illustrated in FIG. 9B. After the epitaxial growth of the unannealed GaAs film 52, the temperature of the semi-insulating GaAs substrate 51 is raised up to 600° C. above the temperature at the time of the epitaxial growth, and the GaAs film 52 is heated for about five (5) minutes using the same apparatus 53, as illustrated in FIG. 9C. After that, conductive portions 55a and 55b with a layered structure of a first titanium thin film and a second gold thin film are formed on an annealed LT-GaAs film 52a using photolithography, as illustrated in FIG. 9D.

FIG. 10 schematically illustrates an example of a photoconductive device fabricated by the conventional fabrication method. The example illustrated in FIG. 10 has a bow-tie antenna structure with conductive portions 55a and 55b in which two symmetrical trapezoids (each being formed by truncating a 5-μm portion of a right-angled apex in a right-angled isosceles triangle with a base of 800 μm) are opposed to each other with a gap g of 5 μm therebetween.

When the photoconductive device fabricated by the above-discussed conventional fabrication method is used, an output of THz electromagnetic radiation of about 2 μW can be obtained by guiding exciting light of 12 mW and applying a bias voltage of 30 V to the photoconductive device. Further, when THz radiation is detected with such a photoconductive device, a current of about 1 nA is caused to flow by guiding exciting light of 4 mW and THz electromagnetic radiation of 1 μW to the photoconductive device.

With the THz radiation, practical applications, such as imaging and sensing, are expected, and industrialization thereof is greatly anticipated. A device with a high light-electromagnetic radiation converting efficiency is indispensable for industrial application of the THz radiation. However, the light-electromagnetic radiation converting efficiency of the above-discussed conventional photoconductive device cannot be said to be high enough.

SUMMARY OF THE INVENTION

It is an object of the present invention to provide techniques for improving light-electromagnetic radiation converting efficiency.

According to one aspect of the present invention for solving the above problem, there is provided a fabrication method of fabricating a structure capable of being used for generation or detection of electromagnetic radiation, which includes a forming step of forming a layer containing a compound semiconductor on a substrate at a substrate temperature below about 300° C., a first heating step of heating the substrate with the layer in an ambience containing arsenic, and a second heating step of heating the substrate with the layer at the substrate temperature above about 600° C. in a gas ambience incapable of chemically reacting on the compound semiconductor.

The following structures capable of being used for generation or detection of electromagnetic radiation can be preferably fabricated using the above fabrication method of the present invention by appropriately regulating the substrate temperature, the heating time (for example, adjustment of a heating period of time within about five (5) minutes), the gas ambience and the like in the second heating step.

According to another aspect of the present invention for solving the above problem, there is provided a structure capable of being used for generation or detection of electromagnetic radiation, which includes a substrate, a first layer containing a compound semiconductor formed on the substrate, and a plurality of conductive portions formed on the first layer with a gap between the conductive portions.

In the structure, particles capable of capturing carriers are present in the first layer. An average interval distance between centers (i.e., centers of gravity) of the particles in the first layer is larger than an average interval distance between centers of particles capable of capturing carriers in a second layer. The second layer contains a compound semiconductor formed on a substrate at a substrate temperature below about 300° C., and the substrate with the second layer is heated in an ambience containing arsenic. Also, a value obtained by subtracting an average diameter of the particle in the first layer from the average interval distance between the centers of the particles in the first layer is approximately below a mean free path of the carrier in the first layer containing the compound semiconductor. In the structure, the average interval distance between the centers of the particles in the first layer is above about 42 nm, for example.

According to another aspect of the present invention for solving the above problem, there is provided a structure capable of being used for generation or detection of electromagnetic radiation, which includes a substrate, a first layer containing a compound semiconductor formed on the substrate, and a plurality of conductive portions formed on the first layer with a gap between the conductive portions.

In the structure, particles capable of capturing carriers are present in the first layer, an average diameter of the particle in the first layer is larger than an average diameter of a particle in a second layer containing a compound semiconductor obtained by forming a layer containing a compound semiconductor on a substrate at a substrate temperature below about 300° C. and heating the substrate with the second layer in an ambience containing arsenic, and a value obtained by subtracting the average diameter of the particle in the first layer from an average interval distance between centers of the particles in the first layer is approximately below a mean free path of the carrier in the first layer containing the compound semiconductor. In the structure, the average diameter of the particle in the first layer is above about 9.3 nm, for example.

According to still another aspect of the present invention for solving the above problem, there is provided an optical semiconductor device which includes the above structure capable of being used for generation or detection of electromagnetic radiation, and an irradiation portion for irradiating the gap between the conductive portions of the above structure with electromagnetic radiation. This optical semiconductor device can be preferably employed as a device for generating THz electromagnetic radiation, a device for detecting THz electromagnetic radiation, or the like.

According to the present invention, it is possible to achieve a device whose light-electromagnetic radiation converting efficiency is improved more than the above-discussed conventional photoconductive device owing to an advantageous distribution structure of particles capable of capturing carriers in a layer containing a compound semiconductor of the present invention.

These advantages, as well as others, will be more readily understood in connection with the following detailed description of the preferred embodiments and examples of the invention in connection with the drawings.

DETAILED DESCRIPTION OF THE PREFERRED EMBODIMENTS

Figure 1A:
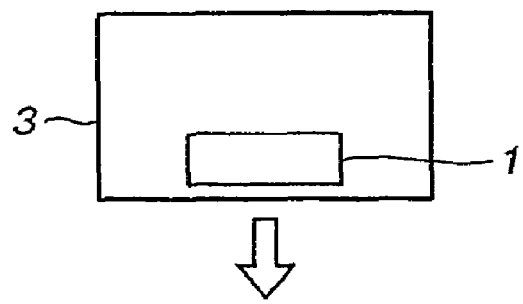
FIGS. 1A to 1E are cross-sectional views schematically illustrating an embodiment of a fabrication method of a photoconductive device according to the present invention, respectively.

FIGS. 1A to 1E show an embodiment of a fabrication method of a photoconductive device (a structure for generating or detecting electromagnetic radiation), and an embodiment of a photoconductive device fabricated by this method. In FIGS. 1A to 1E, reference numeral 1 designates a substrate, reference numeral 2 designates a GaAs film grown at low substrate temperatures, reference numeral 2a designates an annealed LT-GaAs film, reference numeral 2b designates a GaAs film obtained by further heating the annealed LT-GaAs film 2a at a substrate temperature above about 600° C., reference numeral 3 designates a growth apparatus, reference numeral 4 designates a heating furnace, and reference numerals 5a and 5b designate conductive portions.

Although GaAs is used in this embodiment, II-VI or III-V compound semiconductor other than GaAs can also be employed. Particularly, a III-V compound semiconductor can be preferably used. More specifically, compound semiconductors containing arsenic cohesions or particles, such as AlGaAs and InGaAs, can be used. Furthermore, GaP, $(Al_xGa_{1-x})_{1-y}In_yAs$, $Ga_xIn_{1-x}P$, and semiconductors, such as InAs, AlAs, ZnTe and ZnSe, containing cohesions other than arsenic cohesions can be employed.

Figure 1B:
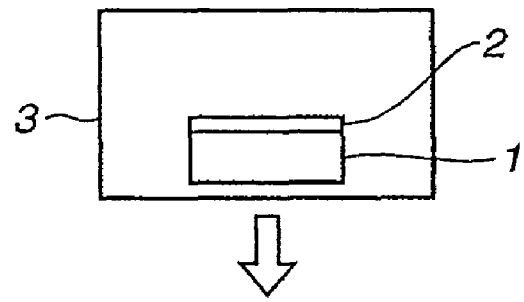

In the fabrication method of this embodiment, the compound semiconductor film 2 is initially formed on the substrate 1, as illustrated in FIG. 1B. Epitaxial growth, vacuum evaporation, sputtering or the like can be used as the film forming method. As the epitaxial growth method, metal organic-chemical vapor deposition (MOCVD), or molecular-beam epitaxy (MBE) can be used. It is preferable to use the MBE in the light of the fact that a good crystallinity can be obtained in non-defect regions. The above film forming process is carried out at the substrate temperature below 300° C.

The substrate temperature in a range from about 150° C. to about 300° C. is suitable for the formation of a film for generating or detecting the THz radiation. More preferably, the substrate temperature must be in a range from about 200° C. to about 270° C. When the film is epitaxially grown at a temperature from about 200° C. to about 270° C., it is possible to achieve a film most suitable for generating or detecting the THz electromagnetic radiation. This is because defects optimum for the THz radiation are formed in the film at those temperatures. In contrast, substrate temperatures above about 300° C. are not preferable since the amount of arsenic for forming clusters or particles for capturing carriers decreases.

Figure 1C:
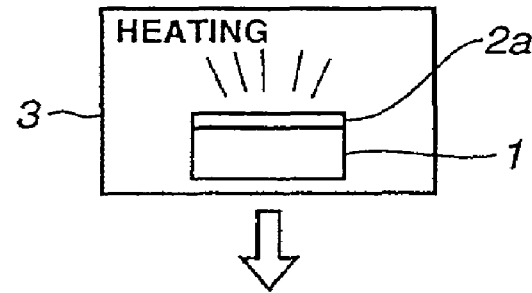

After the growth of the compound semiconductor film 2, the compound semiconductor film is heated at the substrate temperature of about 600° C. in an arsenic ambience, as illustrated in FIG. 1C (a first heating step). The first heating step is performed for the formation of arsenic clusters in the compound semiconductor film. The substrate temperature in the first heating step is not limited to about 600° C. so long as clusters can be formed with arsenic. It is considered that substrate temperatures above about 600° C. will suffice for the formation of arsenic clusters. For example, the same effect can be achieved when the first heating step is performed at temperatures above about 600° C. and below about 800° C.

Figure 1D:
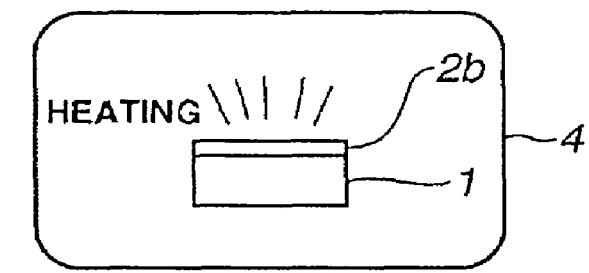

Further, the compound semiconductor film 2a is heated at the substrate temperature above about 600° C. in a gas ambience incapable of chemically reacting on the compound semiconductor, as illustrated in FIG. 1D (a second heating step). In the second heating step, the arsenic is caused to cohere into such a distribution pattern (size, shape, cluster density and the like) that can efficiently generate the THz electromagnetic radiation, and arsenic clusters are hence formed in the compound semiconductor film. The substrate temperature in the second heating step is preferably in a range from about 700° C. to about 800° C. Further, to prevent undesired evaporation of arsenic from the compound semiconductor film, a hydrogen ambience is preferably used as the heating ambience. The same effect as the hydrogen gas can be obtained by an inert-gas ambience.

A nitrogen-gas ambience is not preferable unless a conciliation is established wherein no gallium nitride is created in the compound semiconductor film.

Furthermore, the total pressure of the heating ambience is preferably set at about atmospheric pressure from the standpoint of the achievement of a good thermal conduction in the furnace 4, easiness of production of the ambience, prevention of evaporation of the arsenic, and the like. The atmospheric pressure is a pressure near one atmosphere pressure, or 101325 Pa.

In the thus-formed compound semiconductor film, an average interval distance between centers of the clusters or particles is larger than an average interval distance between centers of particles capable of capturing carriers in a layer containing a particular compound semiconductor. The semiconductor is obtained by forming a layer containing a compound semiconductor on a substrate at a substrate temperature below about 300° C. and heating the substrate with the layer in an ambience containing arsenic. A value obtained by subtracting an average diameter of the particle in the thus-formed compound semiconductor film from the average interval distance between the centers of the particles in this film is below a mean free path of the carrier in the thus-formed compound semiconductor film.

Figure 11A:
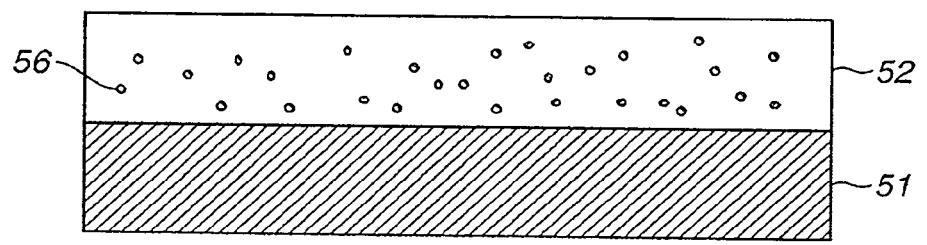
FIG. 11 is a schematic cross-sectional view showing a GaAs film epitaxially grown at a temperature below 300° C., and a physical change of the GaAs film due to its heating at a temperature above the epitaxial growth temperature in the epitaxial growth apparatus.
Figure 11B:
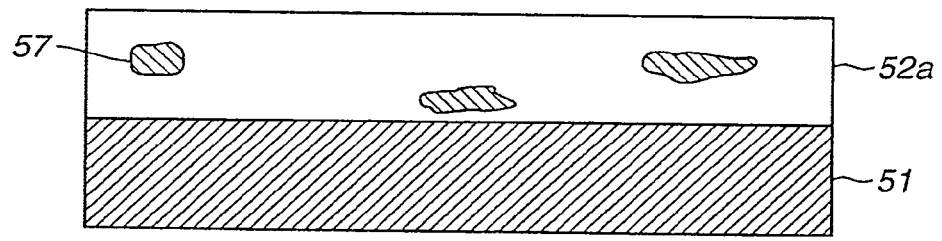

More specifically, the average interval distance between the centers of the particles in the thus-formed compound semiconductor film is above about 42 nm. This value is approximately equal to the average interval distance between centers of clusters or particles in the LT-GaAs film (this is only subjected to the first heating step) as shown in FIG. 11B.

Alternatively, an average diameter of the particle in the thus-formed compound semiconductor film is larger than an average diameter of a particle in a layer containing a compound semiconductor formed on a substrate at a substrate temperature below about 300° C., and heated in an ambience containing arsenic. The value obtained by the above subtraction is below the above mean free path. More specifically, the average diameter of the particle in the thus-formed compound semiconductor film is above about 9.3 nm. This value is approximately equal to the average diameter of the cluster or particle in the LT-GaAs film as shown in FIG. 11B.

The above mean free path can be obtained as follows. The mean free path of carriers (electrons) in the GaAs with a crystallinity subjected to the above-discussed second heating step can be calculated at about 146 nm from the relationship between the principle of equipartition of carrier under the thermal equilibrium, the mobility of carriers, and the relaxation time of carrier. Here, the mobility of electrons in the GaAs is estimated at 8500 cm/(Vs), and the effective mass of an electron in the GaAs is estimated to be 0.067 of the rest mass of an electron (see Series in Electronic Material "Gallium Arsenide", published by Maruzen Co., Ltd. p. 29). Those values are reasonable ones considering the crystallinity of the GaAs subjected to the above-discussed second heating step.

A description will be given for the reason for achievement of a higher light-THz radiation converting efficiency (a higher light-electromagnetic radiation converting efficiency) due to the above-discussed structure. It is considered that a high mobility of carriers and trapping of carrier (electron) by the arsenic cohesion or the like prior to its traveling over the mean free path are necessary for effective generation of the THz radiation. Reasons therefor are that the amount of a photocurrent increases as the mobility of carriers becomes larger, and that carrier is likely to be scattered by phonon or the like if the carrier travels over a distance above the mean free path.

The mobility of carriers is high in this embodiment of the present invention, since the crystallinity of GaAs around the arsenic cohesion is improved as compared to the conventional structure. Further, it is considered that the carrier is trapped by the arsenic cohesion before being scattered, because the value obtained by the above subtraction is below the above mean free path, and the average interval distance between the centers of the particles is above about 42 nm or the average diameter of the particle is above about 9.3 nm, for example. Thus, in the present invention including the above embodiment, a device with a more improved light-electromagnetic radiation converting efficiency than the conventional photoconductive device can be achieved owing to the fact that particles or clusters capable of capturing carriers in a layer containing a compound semiconductor are distributed in the above-described particular pattern.

Figure 1E:
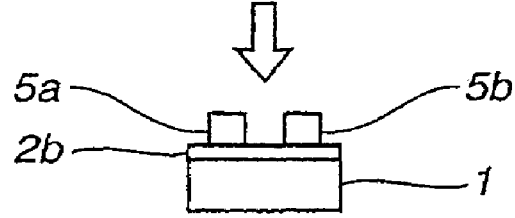

After heating in the second heating step, conductive portions 5a and 5b are formed on the film 2b, as illustrated in FIG. 1E. The conductive portions 5a and 5b are formed on the same surface of the film 2b, but these portions 5a and 5b can be formed on different upper and lower surfaces of the film 2b with an appropriate gap being set therebetween, for example. The conductive portions 5a and 5b are preferably formed in an appropriate antenna configuration, and can be shaped into a configuration of bow-tie type, dipole type, patch type, slot type, spiral type, log-periodic type, or the like. Further, different types can be simultaneously used, or a plurality of the same types can be used.

Structures of conductive materials of the conductive portions 5a and 5b can be a vacuum-evaporated structure of first a titanium layer and second a gold layer, a vacuum-evaporated and alloyed structure of first a gold germanium alloy layer, second a nickel layer and third a gold layer (AuGe/Ni/Au conductive portions), and a vacuum-evaporated and alloyed structure of first a gold germanium alloy layer and second a gold layer (AuGe/Au conductive portions). In the case of the AuGe/Ni/Au or AuGe/Au conductive portions, a contact resistance between the conductive portions and the substrate is reduced, and hence, a higher light-THz radiation converting efficiency can be obtained.

Further, since the crystallinity of the GaAs around the arsenic cohesions is improved in this embodiment, it is possible to provide a photoconductive device whose maximum light-terahertz (electromagnetic radiation) converting efficiency defined by the light-terahertz (electromagnetic radiation) converting efficiency at the time of application of the maximum bias accompanying no breakdown is enhanced. In other words, insulation of the photoconductive portion would not be broken even if a high bias voltage is applied thereto (i.e., the photoconductive portion has a high withstanding voltage), so that a higher bias voltage can be applied to the photoconductive portion and a larger photocurrent can be created.

Moreover, since the mobility of free carriers generated in the photoconductive portion by exciting light is large, the above embodiment can also be a photoconductive device with a high THz radiation detecting sensitivity. That is, since the mobility of free carriers is large, free carriers can be readily accelerated by the THz electromagnetic radiation, leading to a higher current flow.

More specific embodiments of a THz radiation generating device, a THz radiation detecting device, and fabrication methods of these devices according to the present invention will hereinafter be described with reference to the drawings.

In a first embodiment, a device and its fabrication method are fundamentally the same as those of the above-discussed embodiment. To compare and evaluate advantageous effects of the first embodiment, five kinds of devices were fabricated. In fabrication processes of those five devices, processes other than the above-discussed second heating step were conducted under the same conditions, and only the second heating processes were performed under different conditions, respectively.

In the fabrication method of those five devices, a compound semiconductor film 2 with a thickness of 1.5 μm was initially grown on a (100) face of semi-insulating GaAs substrate 1 with a thickness of 500 μm (see FIG. 1A) at the substrate temperature of 250° C. using the molecular-beam epitaxy, as illustrated in FIG. 1B. After the epitaxial growth of the GaAs film 2, the temperature of the semi-insulating GaAs substrate 1 was raised up to 600° C. in the same epitaxial growth apparatus 3, and the GaAs substrate 1 with the GaAs film 2 was heated for ten (10) minutes in an arsenic ambience, as illustrated in FIG. 1C.

After the semi-insulating GaAs substrate 1 was taken from the epitaxial growth apparatus 3, the semi-insulating GaAs substrate 1 was put in a heating furnace 4, and heated at the substrate temperature above about 600° C. for ten (10) minutes in a hydrogen ambience, as illustrated in FIG. 1D. Here, a different GaAs substrate may be placed on the LT-GaAs film for the purpose of prevention of dissociation of arsenic from the LT-GaAs film due to heat. The fabrication method of this embodiment is different from the conventional fabrication method chiefly in such a second heating step. In this step, the semi-insulating GaAs substrate 1 subjected to the step of FIG. 1C was divided into five pieces (not shown in FIG. 1D), and these divided substrates were subjected to the second heating steps under different conditions, respectively. Heated temperatures during the different second steps were 500° C., 600° C., 700° C., 750° C. and 800° C., respectively.

Figure 2:
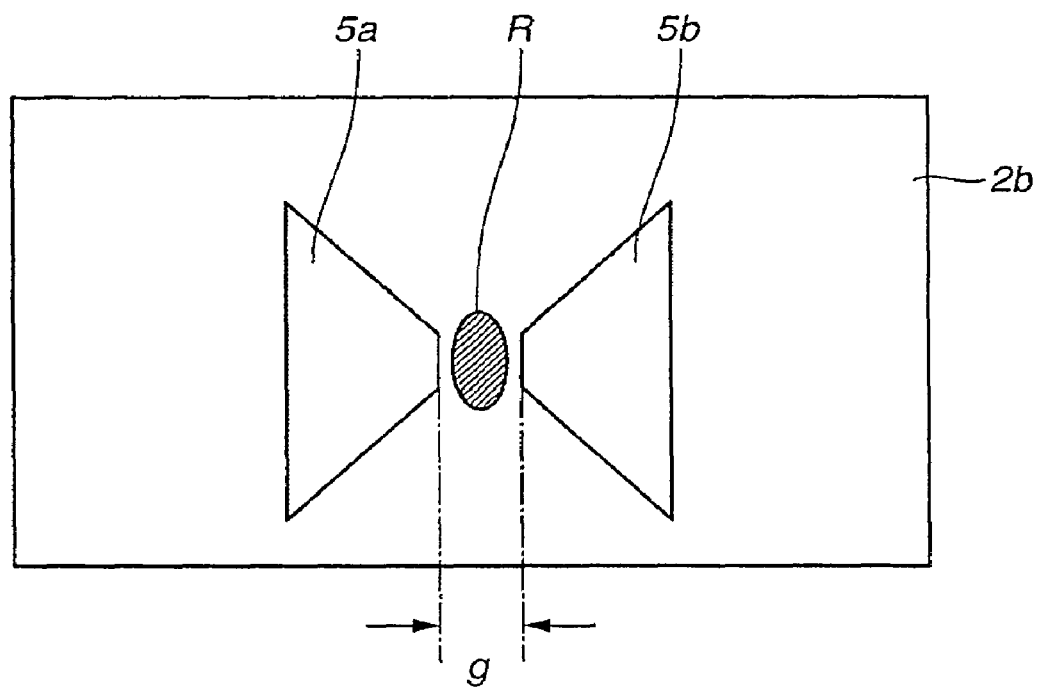
FIG. 2 is a schematic plan view illustrating an embodiment of a photoconductive device according to the present invention.

After that, conductive portions 5a and 5b with a layered structure of a first titanium thin film and a second gold thin film were formed on the annealed LT-GaAs film 2b using photolithography, as illustrated in FIG. 1E. FIG. 2 schematically illustrates an example of the thus-fabricated photoconductive device. The example illustrated in FIG. 2 has a bow-tie antenna structure with conductive portions 5a and 5b in which two symmetrical trapezoids (each being formed by truncating a 5-μm portion of a right-angled apex in a right-angled isosceles triangle with a base of 800 μm) are opposed to each other with a gap g of 5 μm therebetween. However, values, materials and structures of the embodiment are not limited to those described above.

Figure 3:
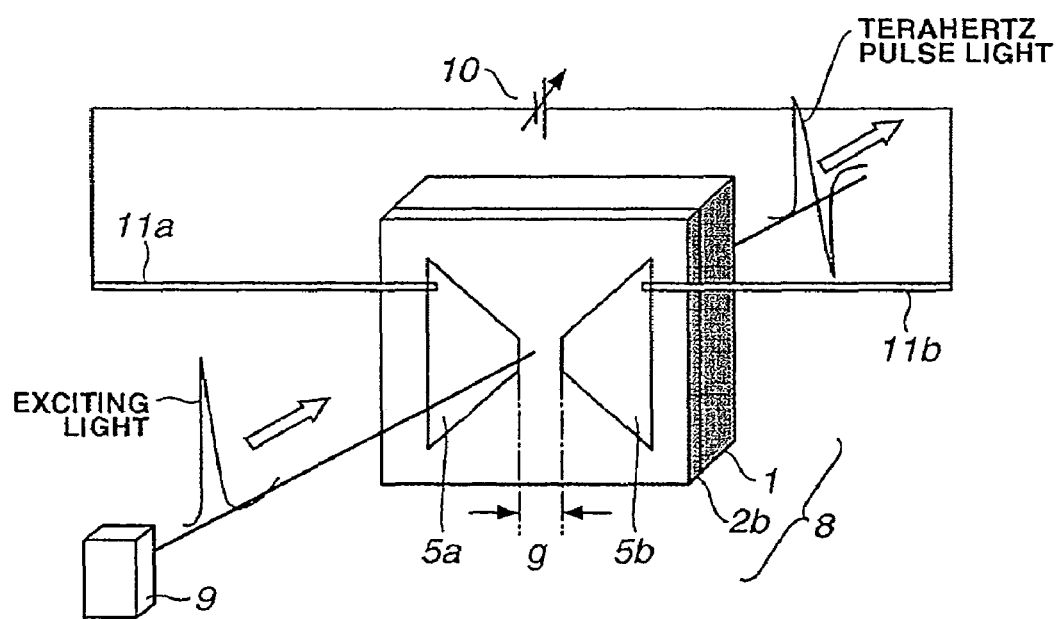
FIG. 3 is a schematic perspective view illustrating an embodiment of a structure for generating THz electromagnetic radiation using a photoconductive device according to the present invention.

A description will now be given for a setup for generating THz radiation using the above-discussed photoconductive device. This setup includes the above-discussed photoconductive device 8 acting as a device for generating THz radiation, an irradiation system 9, and a light source 10 acting as a voltage applying portion capable of adjusting its output voltage, as illustrated in FIG. 3. The irradiation system 9 irradiates a region R of the gap g between the conductive portions 5a and 5b in the THz radiation generating device 8 with exciting pulsed light, such as ultra-short pulsed laser light of femtosecond pulsed laser light, as illustrated in FIGS. 2 and 3. The irradiation system 9 includes a laser light source, and a lens for adjusting the size of the irradiated region when necessary, for example.

The light source 10 applies a bias voltage between the conductive portions 5a and 5b through electric wires 11a and 11b connected to output terminals of the light source 10.

In the structure for generating THz radiation of the first embodiment, even when the bias voltage is applied between the two conductive portions 5a and 5b by the light source 10, almost no current flows since a resistance between the two conductive portions 5a and 5b (the gap portion) is normally very high. Upon irradiation of the gap portion with the exciting pulsed light, such as ultra-short pulsed laser light, having an energy larger than an energy of the band gap of the GaAs film 2b by the irradiation system 9, free carriers are stimulated and generated at the gap portion. At this moment, the resistance of the gap portion lowers, and a current flows between the conductive portions 5a and 5b. The current flows only for very short time, since the pulse width of the exciting laser light is very short and the lifetime of the induced free carriers is short. The current thus changes with time.

It is accordingly possible to generate electromagnetic radiation whose electric-field amplitude is proportional to a value obtained by the time derivative of the above pulse current. When the pulse width of the exciting laser light is short enough (for example, below about 100 femtoseconds), a spectrum obtained by the Fourier transform of the generated electromagnetic radiation reaches several terahertz on a high-frequency side. This is the terahertz (THz) electromagnetic radiation.

Figure 5:
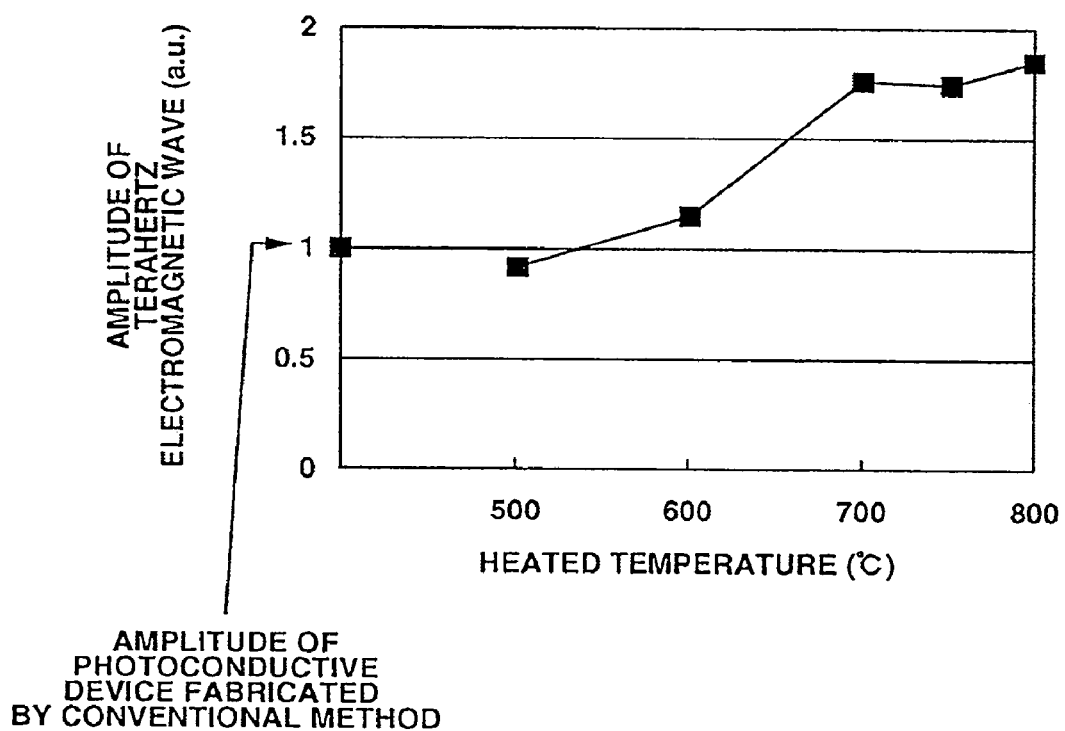
FIG. 5 is a graph showing a comparison between amplitudes of THz electromagnetic waves or radiation of photoconductive devices of the present invention and the above-discussed conventional photoconductive device.

The light-terahertz radiation converting efficiencies of the photoconductive devices fabricated by the fabrication methods of this embodiment were compared with that of the photoconductive device fabricated by the conventional fabrication method discussed above. FIG. 5 shows experimental results exhibiting advantageous effects of this embodiment of the present invention. As a device for generating THz radiation, the five photoconductive devices fabricated by the five fabrication methods of this embodiment and the photoconductive device fabricated by the above-discussed conventional fabrication method were used. A photoconductive device fabricated by the conventional fabrication method was commonly used as a device for detecting THz radiation.

The photoconductive device fabricated by the conventional fabrication method, which was used as a comparative sample for showing the advantageous effects of this embodiment, was fabricated by an example of the conventional fabrication method described in the Description of the Related Background Art and shown in FIGS. 9A to 9D.

The intensity of ultra-short pulsed light incident on each THz radiation generating device was commonly 10 mW. The bias voltage applied between the conductive portions in each THz radiation generating device was commonly 10 V.

In the graph of FIG. 5, the abscissa indicates the temperature of the substrate heated by the heating furnace 4 in the second heating step, and the ordinate indicates the amplitude of the THz electromagnetic wave or radiation generated by each photoconductive device. In the ordinate, the amplitude of the THz electromagnetic wave or radiation generated by the photoconductive device fabricated by the conventional fabrication method is assumed to be one (1).

As can be seen from the experimental results shown in FIG. 5, the amplitudes of the THz radiation generated from the photoconductive devices subjected to the second heating steps for heating the GaAs film at temperatures above 600° C. by the heating furnace 4 are larger than those of the photoconductive device fabricated by the conventional fabrication method. Therefore, it is demonstrated that the photoconductive devices fabricated by the fabrication methods of the first embodiment have higher light-THz radiation converting efficiencies than the photoconductive device fabricated by the conventional fabrication method.

Further, the light-THz radiation converting efficiency of the device, whose temperature heated by the heating furnace was 700° C., was proved to be higher and improved more than that of the device whose temperature heated by the heating furnace was 600° C. In contrast thereto, the light-THz radiation converting efficiencies of the devices, whose temperatures heated by the heating furnace were respectively 750° C. and 800° C., were proved to be approximately equal to that of the device whose temperature heated by the heating furnace was 700° C.

In other words, an increase in the light-THz radiation converting efficiency is saturated at about 700° C. This fact reveals that a device with a high light-THz radiation converting efficiency can be effectively fabricated by heating the GaAs film at temperatures above about 700° C. in the second heating step. It can be thus seen from the experimental results that a preferable range of the temperature in the second heating step is from about 700° C. to about 800° C.

Figure 4:
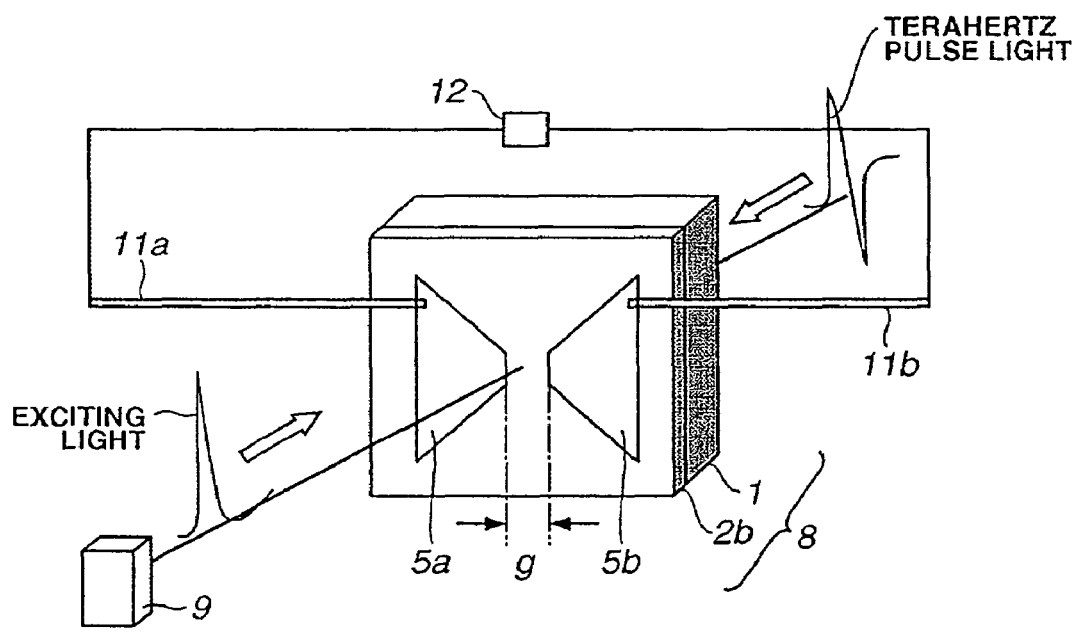
FIG. 4 is a schematic perspective view illustrating an embodiment of a structure for detecting THz electromagnetic radiation using a photoconductive device according to the present invention.

A description will now be given for a second embodiment of a setup for detecting THz radiation using the above-discussed photoconductive device of the present invention. This setup includes the above-discussed photoconductive device 8 acting as a device for detecting THz radiation, an irradiation system 9, and a circuit 12 acting as a current detecting portion, as illustrated in FIG. 4. The irradiation system 9 irradiates a region R of the gap g between the conductive portions 5a and 5b in the THz radiation detecting device 8 with exciting pulsed light, such as ultra-short (for example, femtosecond) pulsed laser light, as illustrated in FIGS. 2 and 4. The irradiation system 9 includes a laser light source, and a lens for adjusting the size of the irradiated region when necessary.

The current detecting circuit 12 detects a current caused to flow between the conductive portions 5a and 5b through electric wires 11a and 11b connected to output terminals of the current detecting circuit 12.

In the structure for detecting THz radiation of this embodiment, free carriers are stimulated and generated at the gap portion upon irradiation with exciting pulsed light, such as ultra-short pulsed laser light having an energy larger than an energy of the band gap of the GaAs film 2b by the irradiation system 9. At this moment, when the gap portion is irradiated with THz radiation, the free carriers are accelerated in proportion to the electric-field amplitude of the THz radiation. The motion of the free carriers is detected as a current which is caused to flow only for a very short time, since the pulse width of the exciting laser light is very short and the lifetime of the stimulated free carriers is short. It is possible to observe the waveform of the THz radiation by shifting the irradiation timing interval between the THz radiation and the exciting light little by little.

The photoconductive device fabricated by the conventional fabrication method was commonly used as a device for generating THz radiation. Comparison was carried out between the value of a current detected when a photoconductive device fabricated by a fabrication method of this embodiment was used as the THz radiation detecting device 8 and the value of a current detected when a photoconductive device fabricated by a conventional fabrication method was used as the THz radiation detecting device 8 (the comparison result is not shown).

The photoconductive device fabricated by the fabrication method discussed in the description of the first embodiment was used as the photoconductive device fabricated by the fabrication method of the second embodiment. The photoconductive device fabricated by the conventional fabrication method, which was used as a comparative sample for showing the advantageous effects of the second embodiment, was fabricated by an example of the conventional fabrication method described in the Description of the Related Background Art and shown in FIGS. 9A to 9D.

It could be seen from the experimental results that the value of the current detected by the current detecting circuit 12 when THz radiation was received by the photoconductive device fabricated by the method of this embodiment was generally larger than that detected by the current detecting circuit 12 when THz radiation was received by the photoconductive device fabricated by the conventional method. This fact reveals that the photoconductive device fabricated by the method of the second embodiment has a higher THz radiation detecting efficiency than the photoconductive device fabricated by the conventional method.

A third embodiment will be described with reference to FIGS. 6A to 6F. A device and its fabrication method of the third embodiment are as follows.

Figure 6A:
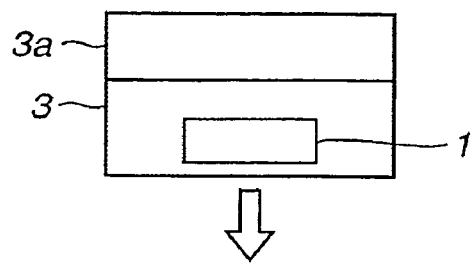
FIGS. 6A to 6F are cross-sectional views schematically illustrating another embodiment of, a fabrication method of a photoconductive device according to the present invention, respectively.
Figure 6B:
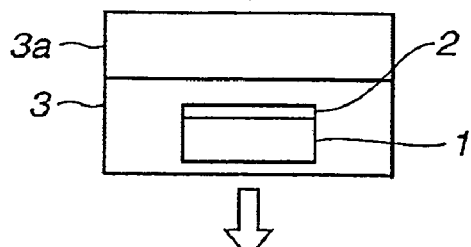
Figure 6C:
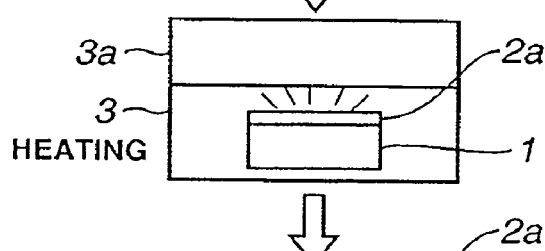

In the fabrication method of the device of this embodiment, the temperature of a semi-insulating GaAs substrate 1 with a thickness of 500 μm (see FIG. 6A) was maintained at 250° C., and a GaAs film 2 with a thickness of 1.5 μm was grown on a (100) face of the semi-insulating GaAs substrate 1 using the molecular-beam epitaxy, as illustrated in FIG. 6B. After the epitaxial growth of the GaAs film 2, the temperature of the semi-insulating GaAs substrate 1 was raised up to 600° C. above the epitaxial growth temperature in the same epitaxial growth apparatus 3, and the GaAs substrate 1 with the GaAs film 2 was heated for ten (10) minutes in an arsenic ambience, as illustrated in FIG. 6C.

Figure 6D:
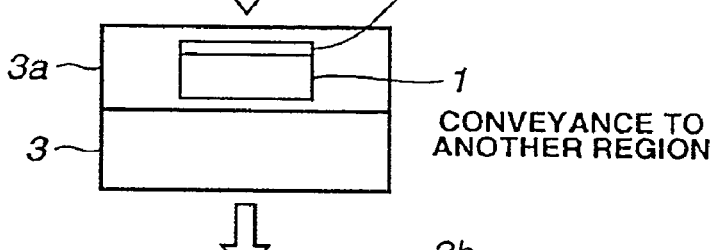
Figure 6E:
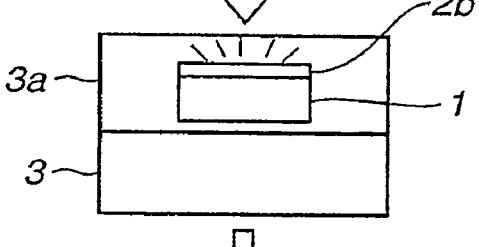

The semi-insulating GaAs substrate 1 was then conveyed to a region 3a partitioned from the epitaxial growth region of the LT-GaAs film 2a in the epitaxial growth apparatus 3, as illustrated in FIG. 6D. After that, the region 3a was filled with a hydrogen gas under one atmosphere pressure at room temperatures, and the semi-insulating GaAs substrate 1 was then heated at the substrate temperature of 700° C. for ten (10) minutes in the hydrogen ambience, as illustrated in FIG. 1E.

Figure 6F:
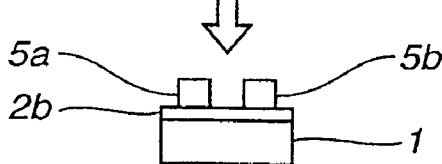

After that, conductive portions 5a and 5b with a layered structure of a first titanium thin film and a second gold thin film were formed on the annealed LT-GaAs film 2b using photolithography or the like, as illustrated in FIG. 6F.

Figure 7:
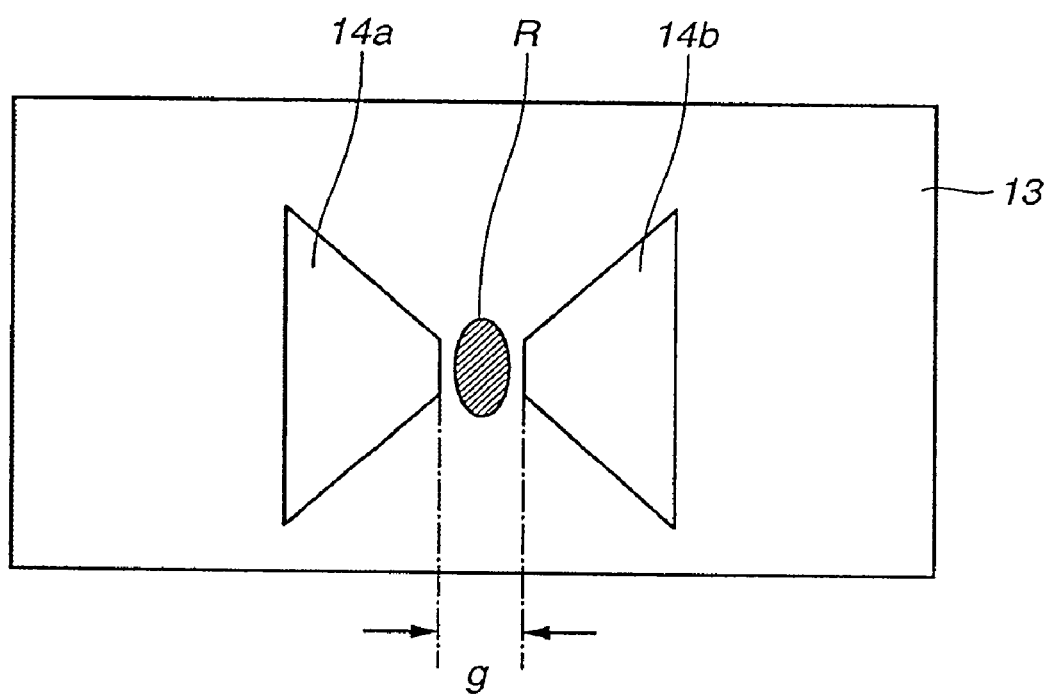
FIG. 7 is a schematic plan view illustrating another embodiment of a photoconductive device according to the present invention.

FIG. 7 schematically illustrates an example of the thus-fabricated photoconductive device. The example illustrated in FIG. 7 has a bow-tie antenna structure with conductive portions 14a and 14b formed on a GaAs film 13. In the conductive portions 14a and 14b, two symmetrical trapezoids (each being formed by truncating a 5-μm portion of a right-angled apex in a right-angled isosceles triangle with a base of 800 μm) are opposed to each other with a gap g of 5 μm therebetween. A method of using the photoconductive device fabricated according to the third embodiment as a THz radiation generating device or a THz radiation detecting device is the same as that described in the first embodiment or second embodiment.

Like the photoconductive device fabricated according to the first embodiment, light-THz radiation converting efficiency and THz radiation detecting sensitivity of the photoconductive device fabricated according to the third embodiment are improved more than the photoconductive device fabricated according to the above-discussed conventional method. In particular, the third embodiment is advantageous in that the fabrication period can be shortened since the steps including the first and second heating steps can be continuously carried out.

In the following, a description will be given for experimental observation examples for confirming that the GaAs films fabricated by the methods in the above embodiments assuredly have distribution patterns of particles or clusters specific to the present invention.

Figure 8:
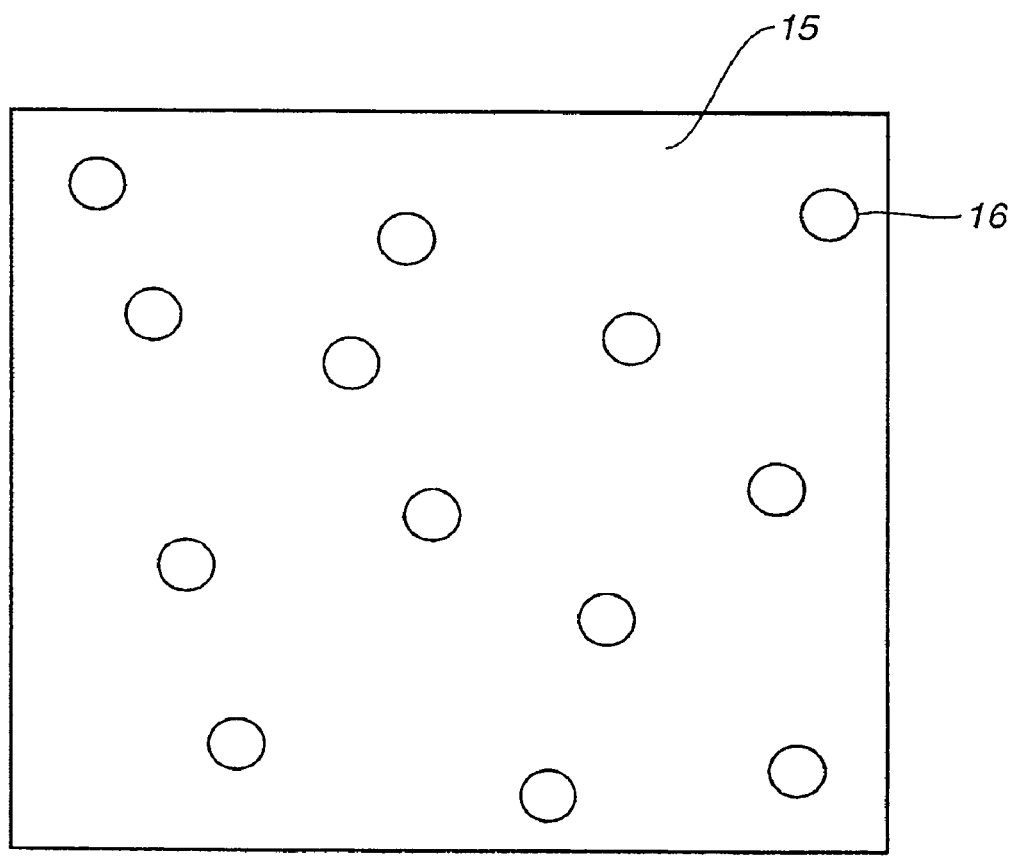
FIG. 8 is a plan view illustrating a GaAs film containing arsenic clusters or particles.
Figure 9A:
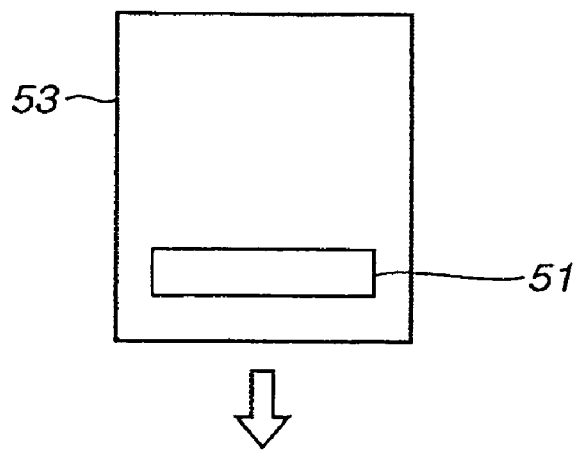
FIGS. 9A to 9D are cross-sectional views schematically illustrating a conventional fabrication method of a photoconductive device, respectively.
Figure 9B:
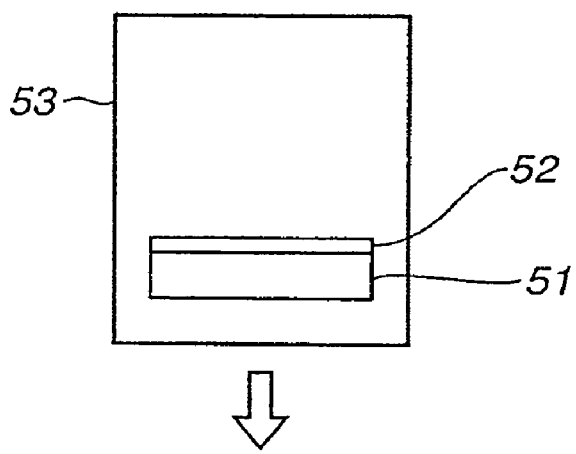
Figure 9C:
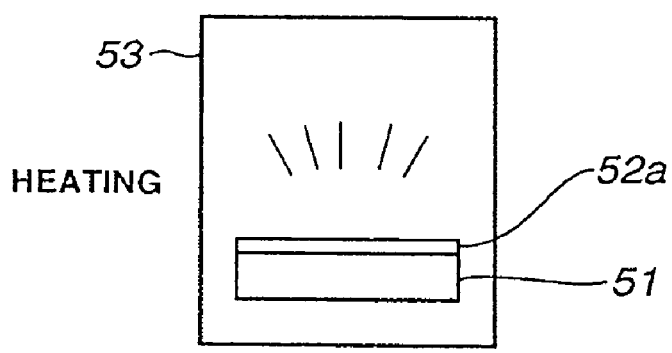
Figure 9D:
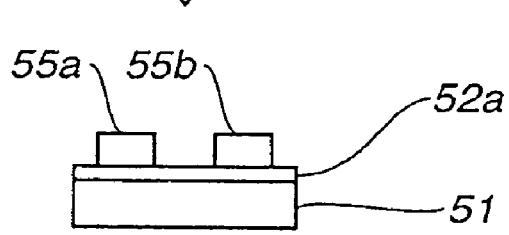
Figure 10:
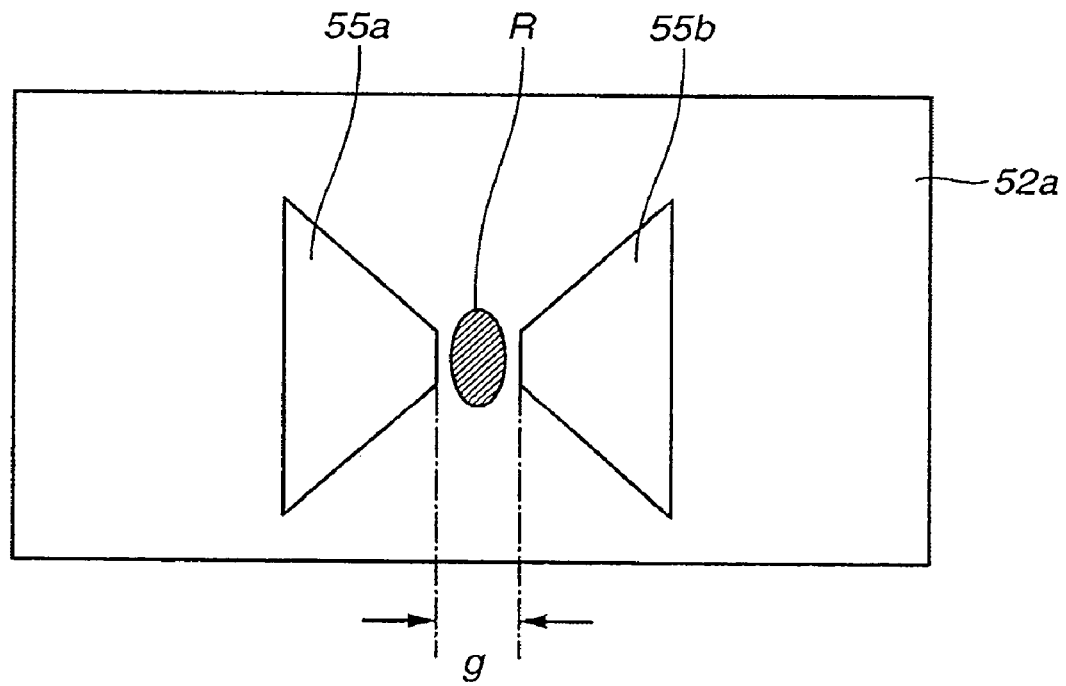
FIG. 10 is a schematic plan view illustrating a conventional photoconductive device.

In a first experimental observation example, GaAs films were formed by methods similar to those of the above embodiments. In the thus-fabricated GaAs film, a multiplicity of arsenic cohesions (particles or clusters) 16 are present in a base GaAs film 15, as illustrated in FIG. 8. Observation of the aresenic cohesions was conducted in the following manner.

A transmission electron microscope (TEM) was used to observe the arsenic cohesions 16 in the GaAs film 15. A cross section of the GaAs film formed by mechanical polishing and an ion milling apparatus was observed. Based on the TEM observation of the cross section of the GaAs film, extraction of the arsenic cohesions 16 was performed, and the number and area of the arsenic cohesions 16 were acquired. Further, the volume of an observation field and the centers of gravity of the particles were calculated from the area of the observation field and the thickness of the sample (this was obtained using an electron energy loss spectroscopy). From the both results, the average diameter of the arsenic cohesion 16 and the average interval distance (the third root of the density of the cohesions or particles) between centers of the arsenic cohesions 16 were obtained.

Conclusively, the following effects could be confirmed. When the average diameter of the arsenic cohesion (or the particle) 16 is above about 9.3 nm, and the value obtained by subtracting the average diameter of the arsenic cohesion from the average interval distance between centers of the arsenic cohesions (i.e., between centers of gravity of the arsenic cohesions) is below the mean free path (about 146 nm) of carriers in the GaAs film of the photoconductive device, or when the average interval distance between centers of the arsenic cohesions is above about 42 nm, and the value obtained by subtracting the average diameter of the arsenic cohesion from the average interval distance between centers of the arsenic cohesions is below the mean free path (about 146 nm) of carriers in the GaAs film of the photoconductive device, it is possible to generate THz radiation whose amplitude is larger than that of the photoconductive device fabricated by the conventional method.

As an example, comparison of the amplitude of the THz radiation was carried out between two photoconductive devices fabricated using a GaAs film whose average diameter of the arsenic cohesion and average interval distance between centers of the arsenic cohesions were in the above-discussed ranges, respectively, and a photoconductive device fabricated using a GaAs film whose average diameter of the arsenic cohesion and average interval distance between centers of the arsenic cohesions were outside the above-discussed ranges, respectively.

The THz radiation generating efficiencies were compared between the three photoconductive devices, namely, a photoconductive device including a GaAs film whose average diameter of the arsenic cohesion and average interval distance between centers of the arsenic cohesions were about 13 nm and about 55 nm, respectively, a photoconductive device including a GaAs film whose average diameter of the arsenic cohesion and average interval distance between centers of the arsenic cohesions were about 22 nm and about 80 nm, respectively, and a photoconductive device including a GaAs film whose average diameter of the arsenic cohesion and average interval distance between centers of the arsenic cohesions were less than 9.3 nm and less than 42 nm, respectively.

It was possible to obtain the GaAs film, whose average diameter of the arsenic cohesion and average interval distance between centers of the arsenic cohesions were less than 9.3 nm and less than 42 nm, respectively, by growing an LT-GaAs film using the conventional fabrication method (see FIGS. 9A to 9D).

Further, it was possible to obtain the GaAs film, whose average diameter of the arsenic cohesion and average interval distance between centers of the arsenic cohesions were about 13 nm and about 55 nm, respectively, by performing heating at 700° C. during the process of FIG. 1D when an LT-GaAs film was formed using the fabrication method discussed in the first embodiment. And, it was possible to obtain the GaAs film, whose average diameter of the arsenic cohesion and average interval distance between centers of the arsenic cohesions were about 22 nm and about 80 nm, respectively, by performing heating at 800° C. during the process of FIG. 1D when an LT-GaAs film was formed using the fabrication method discussed in the first embodiment.

THz radiation was generated by the above photoconductive devices by a method similar to that discussed in the first embodiment. When the amplitude of THz radiation generated from the photoconductive device with the GaAs film, whose average diameter of the arsenic cohesion and average interval distance between centers of the arsenic cohesions were less than 9.3 nm and less than 42 nm, respectively, was assumed to be one (1), the amplitude of THz radiation generated from the photoconductive device with the GaAs film, whose average diameter of the arsenic cohesion and average interval distance between centers of the arsenic cohesions were about 13 nm and about 55 nm, respectively, was about 1.8. Further, the amplitude of THz radiation generated from the photoconductive device with the GaAs film, whose average diameter of the arsenic cohesion and average interval distance between centers of the arsenic cohesions were about 22 nm and about 80 nm, respectively, was also about 1.8.

As described in the foregoing, it was demonstrated that light-THz radiation converting efficiencies of photoconductive devices fabricated by methods of embodiments according to the present invention were improved more than that of the conventional photoconductive device.

A Second experimental observation example will be described. Also in the second experimental observation example, GaAs films were formed by methods similar to those of the above embodiments. Observation of cohesions or particles in the second experimental observation example was conducted in the following manner. In this observation method, the crystallinity of a base GaAs film was obtained by an X-ray diffraction. Incident X-ray was monochromatized using a $Ge_{(440)}$-4-crystal monochromator, and light reflected by a (400) face of the GaAs was received by a $Ge_{(220)}$ analyzer crystal. A reciprocal lattice mapping measurement was thus carried out. From that, a full width at half maximum (FWHM) of a rocking curve with respect to spots of the GaAs film was measured. In this measurement, the crystallinity of a region outside the arsenic cohesions can be measured, and the distribution pattern of the arsenic cohesions can be indirectly observed.

As the result of the crystallinity measurement by the X-ray diffraction, the FWHM of the rocking curve of the GaAs film, whose average diameter of the arsenic cohesion and average interval distance between centers of the arsenic cohesions were less than 9.3 nm and less than 42 nm, respectively, was about 9.65", the FWHM of the rocking curve of the GaAs film, whose average diameter of the arsenic cohesion and average interval distance between centers of the arsenic cohesions were about 13 nm and about 55 nm, respectively, was about 7.53", and the FWHM of the rocking curve of the GaAs film, whose average diameter of the arsenic cohesion and average interval distance between centers of the arsenic cohesions were about 22 nm and about 80 nm, respectively, was about 8.31". The values of the average diameter and the average interval distance of those GaAs films can be confirmed by the method of the first experimental observation example.

THz radiation was generated by the above photoconductive devices by a method similar to that illustrated in FIG. 3. When the amplitude of THz radiation generated from the photoconductive device with the GaAs film, whose FWHM of the rocking curve was about 9.65", was assumed to be one (1), the amplitude of THz radiation generated from the photoconductive device with the GaAs film, whose FWHM of the rocking curve was about 7.53", was about 1.8. Further, the amplitude of THz radiation generated from the photoconductive device with the GaAs film, whose FWHM of the rocking curve was about 8.31", was also about 1.8.

As described in the foregoing, it was also demonstrated that light-THz radiation converting efficiencies of photoconductive devices fabricated by fabrication methods of embodiments according to the present invention were improved more than that of the conventional photoconductive device.

While the present invention has been described with respect to what is presently considered to be the preferred embodiments and examples, it is to be understood that the invention is not so limited. The present invention is intended to cover various modifications and equivalent arrangements included within the spirit and the scope of the appended claims.

This application claims priority from Japanese Patent Application Nos. 2004-92400, filed Mar. 26, 2004, and 2005-58438, filed Mar. 3, 2005, which are hereby incorporated by reference.

What is claimed is:

1. A fabrication method of fabricating a structure that is usable to generate or detect THz electromagnetic radiation, the method comprising:
   a forming step of forming a GaAs epitaxial layer containing arsenic cohesions on a GaAs substrate at a substrate temperature below about 300° C.;
   a first heating step of heating the GaAs substrate with the GaAs epitaxial layer in an ambience containing arsenic at a substrate temperature in a range from 600° C. to 800° C., after the forming step; and
   a second heating step of heating the GaAs substrate with the GaAs epitaxial layer at a substrate temperature in a range from 700° C. to 800° C. in a hydrogen-gas or an inert-gas ambience, after the first heating step,
   wherein, when the second heating step is performed at a temperature of about 700° C., an average diameter of the arsenic cohesions is about 13 nm and an average interval distance between centers of the arsenic cohesions is about 55 nm, and, when the second heating step is performed at a temperature of about 800° C., the average diameter of the arsenic cohesions is about 22 nm and the average interval distance between the centers of the arsenic cohesions is about 80 nm.

2. A fabrication method according to claim 1, wherein the GaAs epitaxial layer is epitaxially grown in the forming step using a molecular-beam epitaxy process.

3. A fabrication method according to claim 1, wherein a total pressure in the second heating step is approximately equal to atmospheric pressure.

4. A fabrication method according to claim 1,
   wherein the forming step of forming the GaAs epitaxial layer on the GaAs substrate at the substrate temperature below about 300° C. is performed in a first chamber of a growth apparatus that is partitioned into the first chamber and a second chamber,
   wherein the first heating step of heating the GaAs substrate with the GaAs epitaxial layer in the ambience containing arsenic is performed in the first chamber,
   wherein the method further comprises:
   conveying the GaAs substrate and the GaAs epitaxial layer on a substrate into the second chamber, and
   filling the second chamber to have a hydrogen-gas or an inert-gas ambience, and
   wherein the second heating step of heating the GaAs substrate with the GaAs epitaxial layer at the substrate temperature in the range from 700° C. to 800° C. is performed in the second chamber, and the second heating step includes preventing evaporation of arsenic from the GaAs epitaxial layer.

5. A fabrication method according to claim 1, further comprising a second forming step of forming a plurality of conductive portions on the GaAs epitaxial layer with a gap between the conductive portions.

6. A fabrication method according to claim 1, wherein, in the second heating step, the arsenic cohesions are caused to cohere into a distribution pattern that can efficiently generate the THz electromagnetic radiation, and arsenic clusters are hence formed in the GaAs epitaxial layer.

7. A fabrication method according to claim 1, wherein in the forming step, the substrate temperature is in a range from about 150° C. to about 300° C.

8. A fabrication method of fabricating a structure that is usable to generate or detect THz electromagnetic radiation, the method comprising:
   a forming step of forming an InGaAs epitaxial layer containing arsenic cohesions on a substrate at a substrate temperature below about 300° C.;
   a first heating step of heating the substrate with the InGaAs epitaxial layer in an ambience containing arsenic at a substrate temperature in a range from 600° C. to 800° C., after the forming step; and
   a second heating step of heating the substrate with the InGaAs epitaxial layer at a substrate temperature in a range from 700° C. to 800° C. in an inert-gas ambience, after the first heating step,
   wherein, when the second heating step is performed at a temperature of about 700° C., an average diameter of the arsenic cohesions is about 13 nm and an average interval distance between centers of the arsenic cohesions is about 55 nm, and, when the second heating step is performed at a temperature of about 800° C., the average diameter of the arsenic cohesions is about 22 nm and the average interval distance between the centers of the arsenic cohesions is about 80 nm.

9. A fabrication method of fabricating a structure that is usable to generate or detect THz electromagnetic radiation, the method comprising:
   a forming step of forming a GaAs epitaxial layer that includes arsenic cohesions on a GaAs substrate at a substrate temperature below about 300° C.;
   a first heating step of heating the GaAs substrate with the GaAs epitaxial layer in an ambience that includes arsenic at a substrate temperature in a range from 600° C. to 800° C., after the forming step; and
   a second heating step of heating the GaAs substrate with the GaAs epitaxial layer at a substrate temperature of about 800° C. in an ambience of hydrogen gas or an inert gas, after the first heating step,
   wherein, after the second heating step, an average diameter of the arsenic cohesions is about 22 nm and an average interval distance between centers of the arsenic cohesions is about 80 nm.

* * * * *